(12) United States Patent
Chen et al.

(10) Patent No.: US 9,624,576 B2
(45) Date of Patent: Apr. 18, 2017

(54) SYSTEMS AND METHODS FOR GAP FILLING IMPROVEMENT

(71) Applicant: Taiwan Semiconductor Manufacturing Company Limited, Hsinchu (TW)

(72) Inventors: Chi-Yuan Chen, Hsinchu (TW);
Li-Ting Wang, Hsinchu (TW);
Teng-Chun Tsai, Hsinchu (TW);
Chun-I Tsai, Hsinchu (TW); Wei-Jung Lin, Taipei (TW); Huang-Yi Huang, Hsin-chu (TW); Cheng-Tung Lin, Hsinchu County (TW); Hong-Mao Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 14 days.

(21) Appl. No.: 14/108,819

(22) Filed: Dec. 17, 2013

(65) Prior Publication Data

US 2015/0170964 A1 Jun. 18, 2015

(51) Int. Cl.
*H01L 21/768* (2006.01)
*C23C 14/58* (2006.01)
*C23C 14/48* (2006.01)
*C23C 14/04* (2006.01)
(Continued)

(52) U.S. Cl.
CPC ........ *C23C 14/5873* (2013.01); *C23C 14/046* (2013.01); *C23C 14/48* (2013.01); *H01L 21/3215* (2013.01); *H01L 21/32134* (2013.01); *H01L 21/32135* (2013.01); *H01L 21/76859* (2013.01); *H01L 21/76876* (2013.01); *H01L 21/76877* (2013.01); *H01L 21/76879* (2013.01)

(58) Field of Classification Search
CPC ......... H01L 21/76883; H01L 21/32135; H01L 21/3215; H01L 21/32134; H01L 21/76859; H01L 21/76876; H01L 21/76879; H01L 21/76877; C23C 14/48; C23C 14/5873; C23C 14/046; C23C 16/045; C23C 16/505
USPC ........................................................ 438/270
See application file for complete search history.

(56) References Cited

U.S. PATENT DOCUMENTS

| 7,329,599 | B1 * | 2/2008 | Wirbeleit | ............... | H01L 21/265 |
| | | | | | 257/E21.199 |
| 2010/0285646 | A1 * | 11/2010 | Lin | .................... | H01L 21/26586 |
| | | | | | 438/270 |
| 2012/0070982 | A1 * | 3/2012 | Yu et al. | ....................... | 438/653 |

(Continued)

*Primary Examiner* — Thomas L Dickey
*Assistant Examiner* — Changhyun Yi
(74) *Attorney, Agent, or Firm* — Jones Day

(57) ABSTRACT

Systems and methods are provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a top portion and a bottom portion. Ion implantation is formed on the first conductive material, the top portion of the first conductive material being associated with a first ion density, the bottom portion of the first conductive material being associated with a second ion density lower than the first ion density. At least part of the top portion of the first conductive material is removed. A second conductive material is formed to fill the opening.

19 Claims, 8 Drawing Sheets

(51) Int. Cl.
*H01L 21/3213* (2006.01)
*H01L 21/3215* (2006.01)

(56) References Cited

U.S. PATENT DOCUMENTS

2013/0001681 A1* 1/2013 Sin et al. ................. 257/330
2015/0140233 A1* 5/2015 Zope ................. C23C 16/045
427/535

* cited by examiner

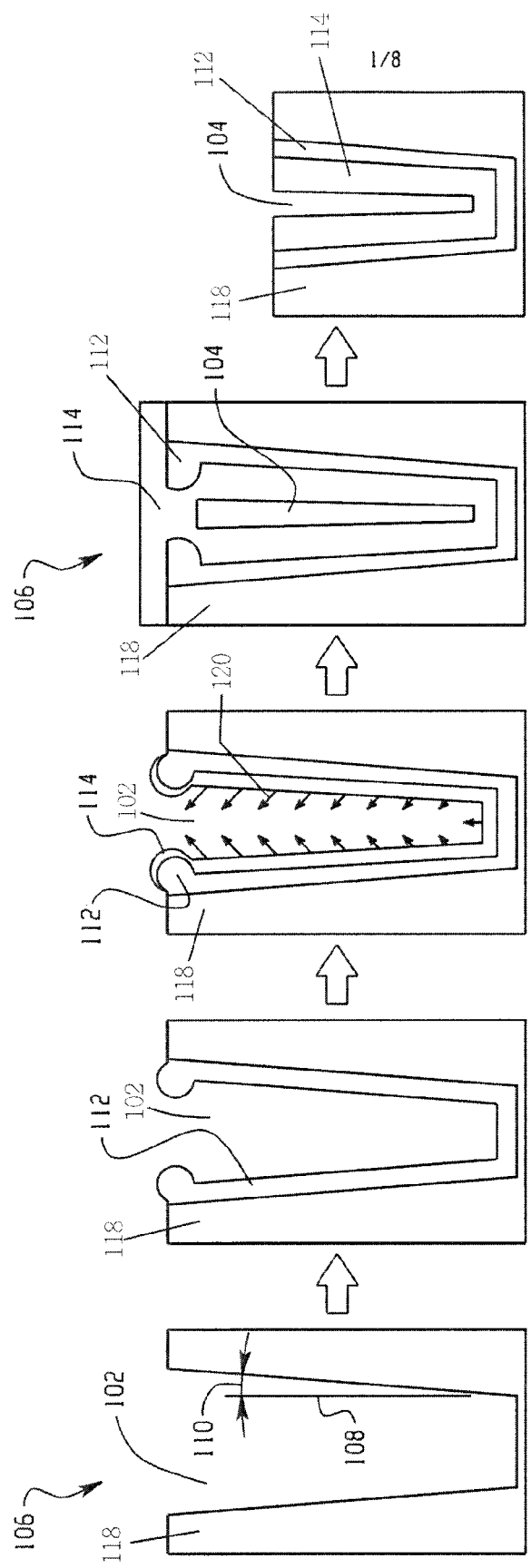

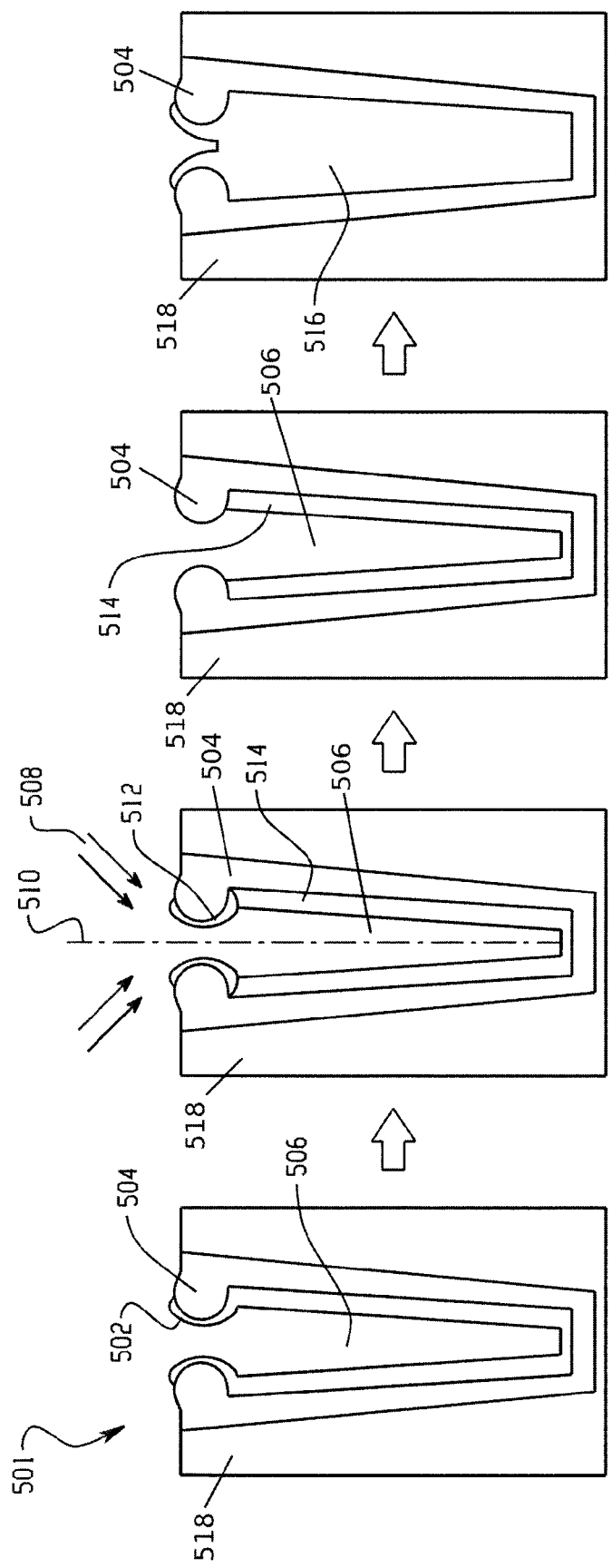

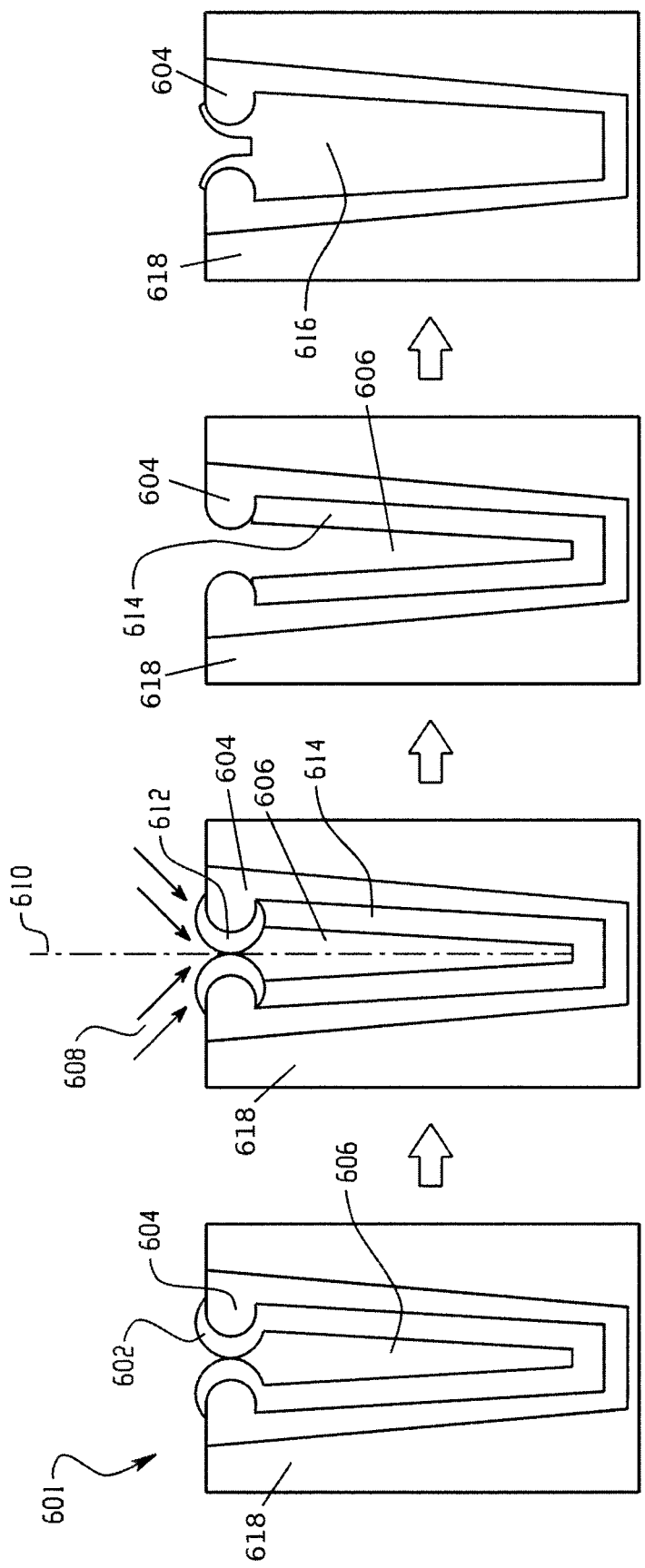

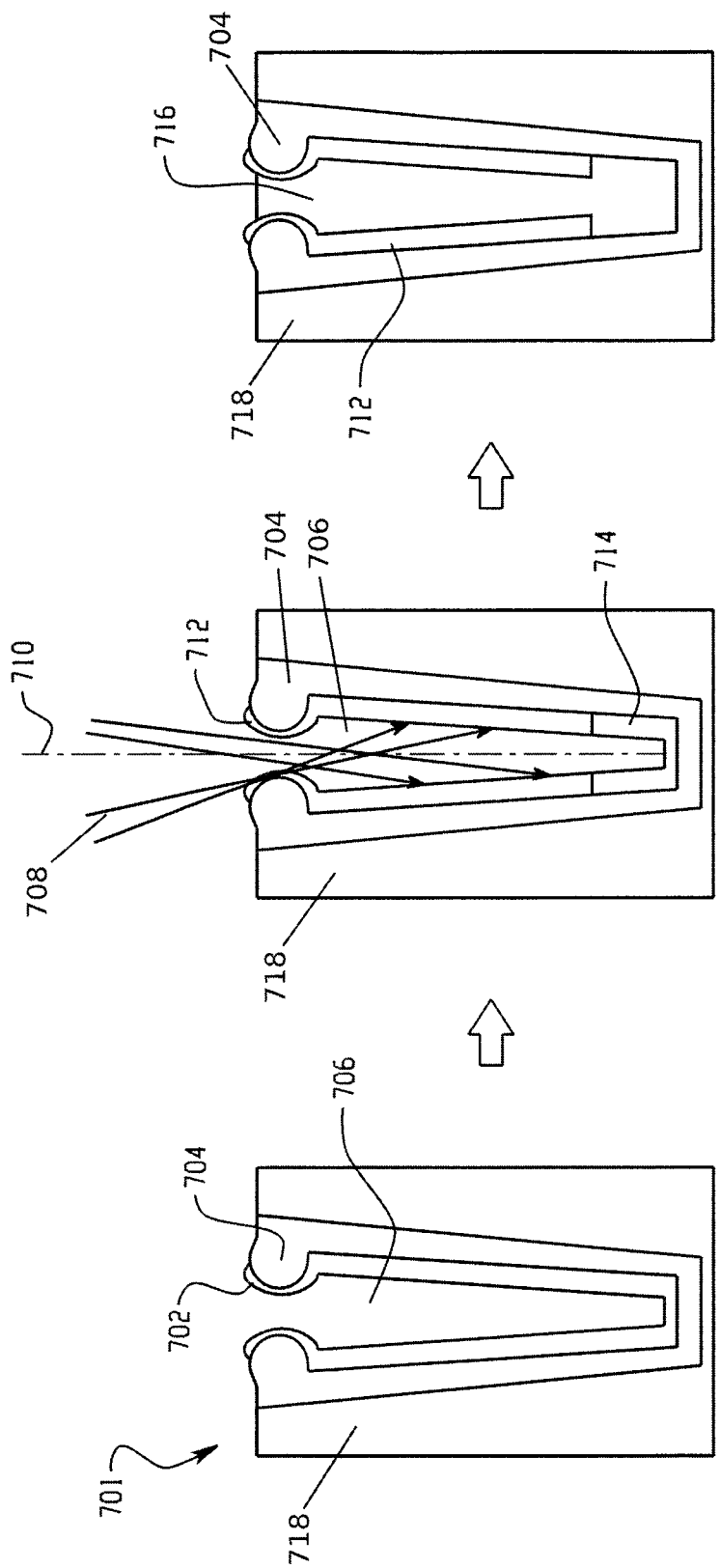

SYSTEMS AND METHODS FOR GAP FILLING IMPROVEMENT

FIELD

The technology described in this disclosure relates generally to semiconductor devices and more particularly to semiconductor device fabrication.

BACKGROUND

With the rapid development of integrated circuit fabrication technology, more and more devices are incorporated on a single integrated circuit (IC) chip, and the size of each device on the IC chip and the spacing between the devices (i.e., feature size) continue to decrease. As feature sizes have become smaller, the demand for higher aspect ratios (i.e., a ratio between the depth and the width of a feature) has steadily increased. It is often difficult to deposit conductive materials into features (e.g., contact holes, via holes) with high aspect ratios to form contacts without generating certain undesirable defects (e.g., seams, voids).

SUMMARY

In accordance with the teachings described herein, systems and methods are provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a top portion and a bottom portion. Ion implantation is formed on the first conductive material, the top portion of the first conductive material being associated with a first ion density, the bottom portion of the first conductive material being associated with a second ion density smaller than the first ion density. At least part of the top portion of the first conductive material is removed. A second conductive material is formed to fill the opening.

In one embodiment, a method is provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a bottom portion and a top portion. Ion implantation is performed on the first conductive material. A second conductive material is formed on the first conductive material to fill the opening, a first formation rate of the second conductive material on the top portion of the first conductive material being smaller than a second formation rate of the second conductive material on the bottom portion of the first conductive material.

In another embodiment, a system includes: a deposition apparatus and an ion-implantation tool. The deposition apparatus is configured to form a first conductive material to partially fill an opening in a semiconductor structure. The first conductive material includes a top portion and a bottom portion. The ion-implantation tool is configured to perform ion implantation on the first conductive material. The top portion of the first conductive material is associated with a first ion density, and the bottom portion of the first conductive material is associated with a second ion density smaller than the first ion density. The deposition apparatus is further configured to form a second conductive material to fill the opening.

BRIEF DESCRIPTION OF THE DRAWINGS

FIG. 1(a)-FIG. 1(e) depict example diagrams showing contact formation in a feature.

FIG. 5(a)-FIG. 5(d) depict example diagrams showing contact formation in a feature using ion implantation.

FIG. 6(a)-FIG. 6(d) depict other example diagrams showing contact formation in a feature using ion implantation.

FIG. 7(a)-FIG. 7(c) depict example diagrams showing contact formation in a feature using ion implantation.

DETAILED DESCRIPTION

Figure 2A:
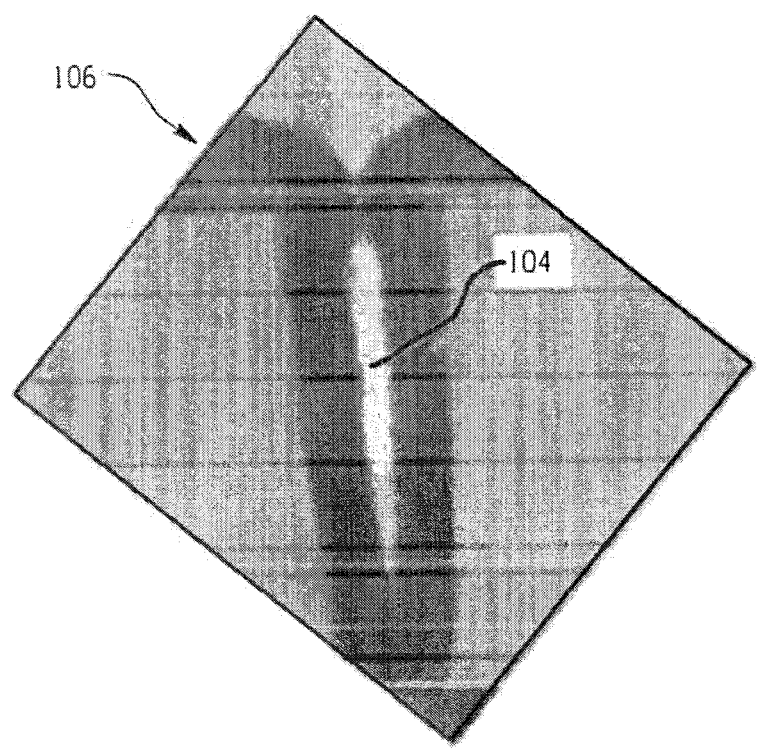
FIG. 2(a)-FIG. 2(b) depict example microscopic images showing seams/voids formed during contact formation in a feature.

FIG. 1(a)-FIG. 1(e) depict example diagrams showing contact formation in a feature. The feature 102 corresponds to a gap or an opening (e.g., a contact hole, a via hole, a gate trench, etc.) with a high aspect ratio (i.e., a ratio between the depth and the width of the feature). A seam/void 104 is formed during the contact formation in the feature 102.

Specifically, as shown in FIG. 1(a), the feature 102 (e.g., a contact hole, a via hole, a gate trench, etc.) is formed (e.g., through dry etching or wet etching) in a substrate 118 of a semiconductor structure 106, and is defined by a bottom surface and one or more side surfaces of the substrate 118. For example, relative to a vertical axis 108, one of the side surfaces is at a tilt angle 110. As shown in FIG. 1(b), one or more glue layers 112 (e.g., titanium and/or titanium nitride, etc.) are deposited in the feature 102 to partially fill the opening. A top portion of the glue layers 112 often has a larger thickness than a bottom portion of the glue layers 112. That is, the top portion of the glue layers 112 (e.g., the ball-shaped top portion) overhangs the bottom portion of the glue layers 112.

Figure 2B:
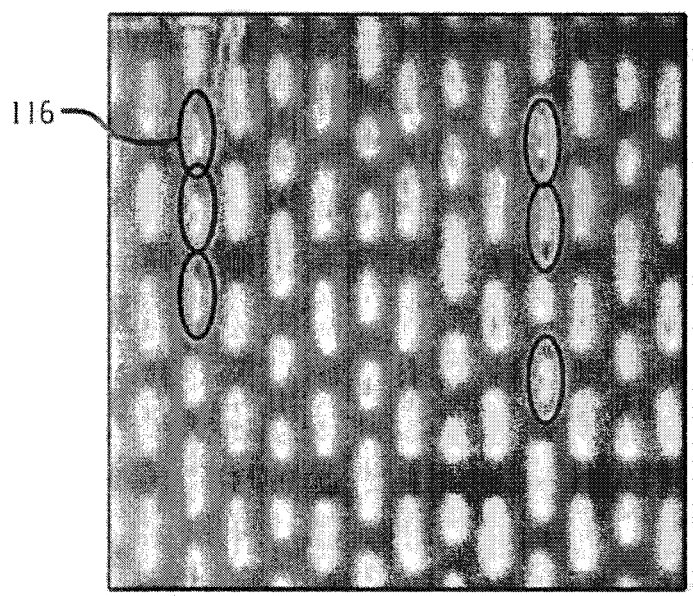

A conductive material 114 (e.g., tungsten, cobalt, aluminum, or other suitable conductive materials) is deposited on the glue layers 112 to further fill the opening, as shown in FIG. 1(c). For example, the conductive material 114 grows (indicated by arrows 120) in conformation with the glue layers 112. Because the top portion of the glue layers 112 overhangs the bottom portion, the conductive material 114 grows to seal the opening at the top and thus the seam/void 104 is formed during the process, as shown in FIG. 1(d). FIG. 2(a) illustrates a microscopic image (e.g., a transmission-electron-microscopic image) of the seam/void 104 within the semiconductor structure 106. A chemical-mechanical polishing/planarization (CMP) process is carried out to remove part of the conductive material 114, and the seam/void 104 is exposed, as shown in FIG. 1(e). FIG. 2(b) illustrates another microscopic image of certain seams/voids exposed in the semiconductor structure 106. The seams/voids (e.g., dark dots) are shown in the circles 116. Such seams/voids often negatively affect the electrical properties of the formed contacts.

Figures 3A, 3B:
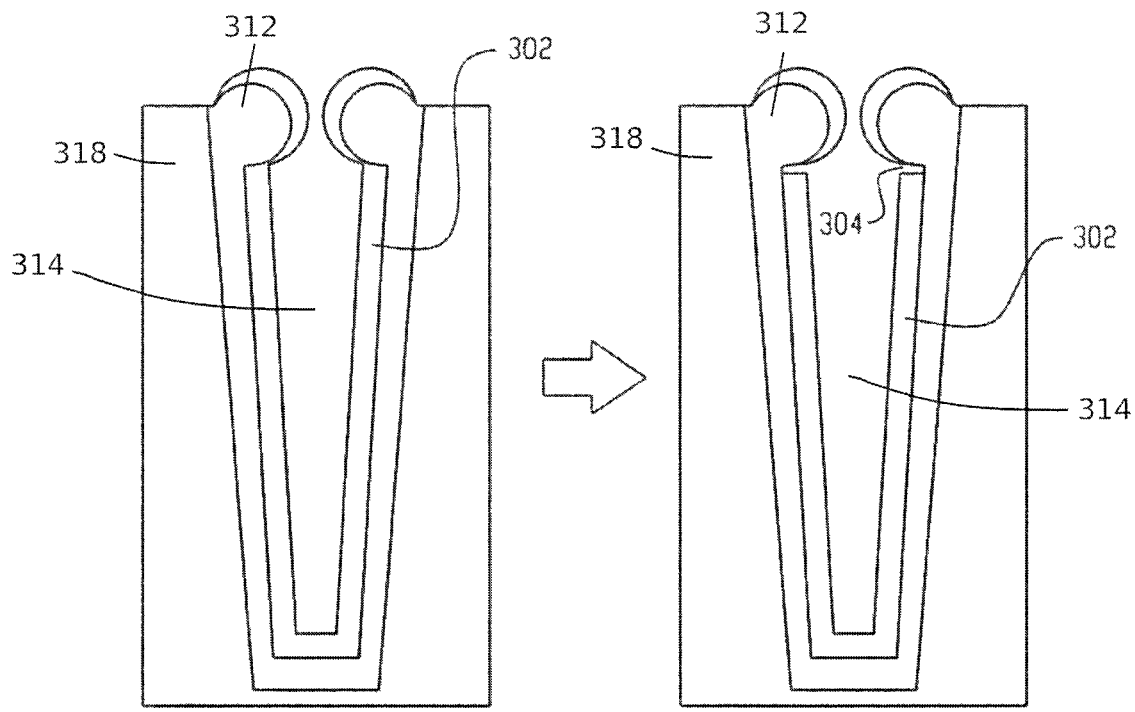
FIG. 3(a)-FIG. 3(c) depict example diagrams showing plasma treatment of conductive materials for contact formation.
Figures 4A, 4B:
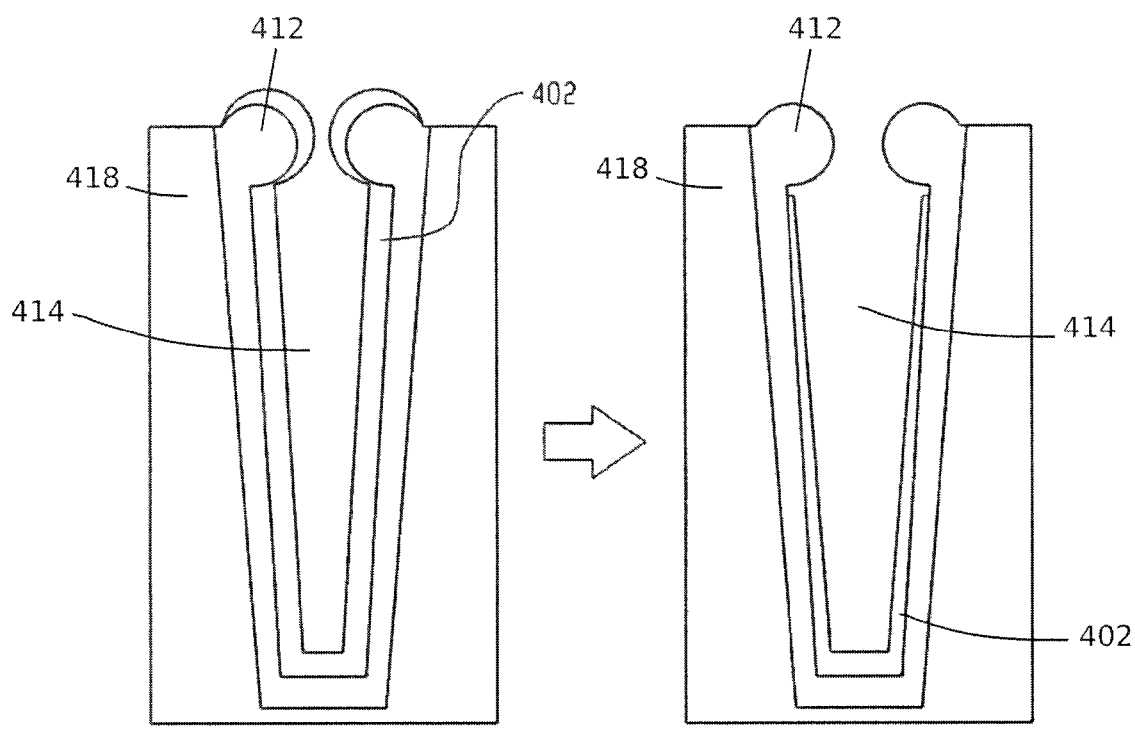
FIG. 4(a)-FIG. 4(c) depict example diagrams showing plasma etching of conductive materials for contact formation.

Plasma treatment or plasma etching may be used to ameliorate the above-noted seam/void problem. For example, a first conductive material (e.g., the conductive material 302 as shown in FIG. 3(a) or the conductive material 402 as shown FIG. 4(a)) is deposited on one or more glue layers (e.g. the glue layers 312 as shown in FIG. 3(a) or the glue layers 412 as shown in FIG. 4(a)) in a feature (e.g., a contact hole, a via hole, a gate trench, etc.) in a substrate (e.g., the substrate 318 as shown in FIG. 3(a) or the substrate 418 as shown in FIG. 4(a)) to partially fill the opening of the feature (e.g., the feature 314 as shown in FIG. 3(a) or the feature 414 as shown in FIG. 4(a)). Then, plasma treatment (e.g., as shown in FIG. 3(b)) or plasma etching (e.g., as shown in FIG. 4(b)) is performed on the first conductive material before growing a second conductive material to further fill the opening.

Figure 3C:
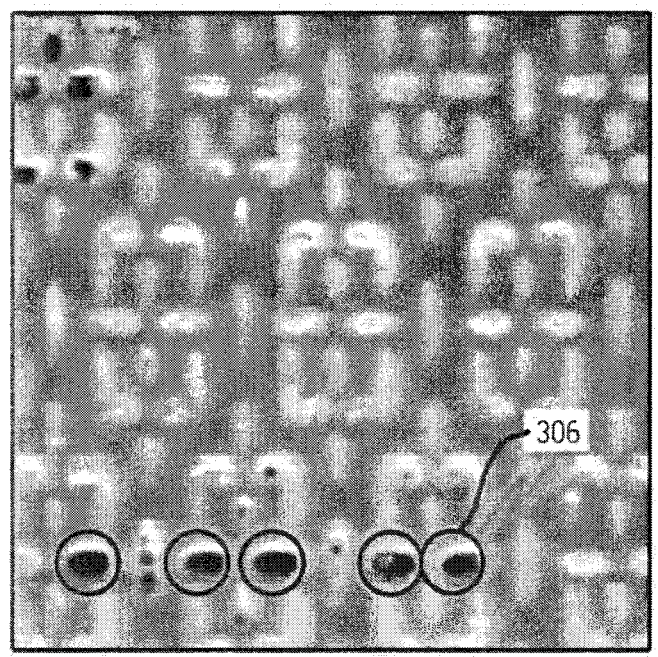
Figure 4C:
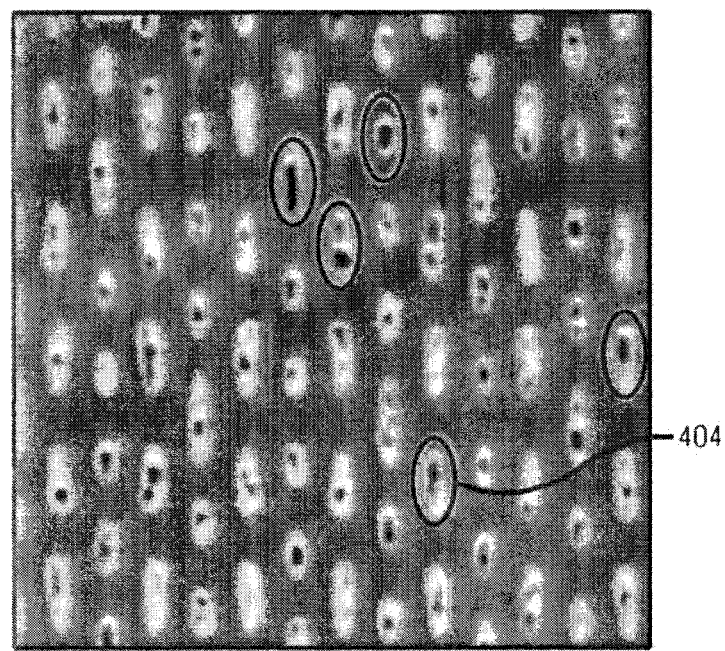

However, plasma treatment or plasma etching is often performed using chemical vapor deposition (CVD). It is usually difficult to precisely control the spatial distribution of the plasma and the processing extent, and oftentimes a wafer may be over-treated or over-etched. For example, as shown in FIG. 3(b), plasma over-treatment often results in a void 304 in the first conductive material 302. Furthermore, the physical/chemical properties of the over-treated first conductive material 302 may be changed significantly due to plasma over-treatment so that the second conductive material cannot be deposited properly on the first conductive material 302. FIG. 3(c) depicts an example microscopic image showing certain features after plasma over-treatment (e.g., in the circles 306). In another example, as shown in FIG. 4(b), plasma over-etching may remove too much of the first conductive material 402, and the remaining first conductive material 402 becomes too thin to grow the second conductive material properly. FIG. 4(c) depicts an example microscopic image showing certain features after plasma over-etching (e.g., in the circles 404).

FIG. 5(a)-FIG. 5(d) depict example diagrams showing contact formation in a feature using ion implantation. As shown in FIG. 5(a), a semiconductor structure 501 including a substrate 518 and a feature 506 formed in the substrate 518 is provided for contact formation, and the feature 506 corresponds to a gap or an opening (e.g., a contact hole, a via hole, a gate trench, etc.). A first conductive material 502 (e.g., tungsten, cobalt, aluminum, or other suitable conductive materials) is formed on one or more glue layers 504 (e.g., titanium and/or titanium nitride, etc.) to partially fill the opening of the feature 506. For example, a top portion of the glue layers 504 overhangs a bottom portion of the glue layers 504. The first conductive material 502 grows in conformation with the glue layers 504, but a top portion of the first conductive material 502 does not converge to seal the opening.

Ion implantation (indicated by arrows 508) is performed to treat the first conductive material 502, as shown in FIG. 5(b). The conditions (e.g., incident angle, dose, energy) of the ion implantation depend at least in part on the dimensions (e.g., depth, width, tilt angle of side surfaces) of the feature 506. For example, the feature 506 has a depth of about 100 nm and a width of about 20nm, and the thickness of the first conductive material is about 3 nm. The ion implantation implements fluoride ions (e.g., $F^+$) with a dose of about $10^{15}$ $cm^{-2}$. The energy associated with the ion implantation is about 10 keV, and an incident angle of the ion beams is about 45° relative to a vertical axis 510. More ions are implanted in a top portion 512 of the first conductive material 502 than a bottom portion 514 of the first conductive material 502. That is, the top portion 512 is associated with a higher ion density than the bottom portion 514. As a result, physical/chemical properties of the top portion 512 have been changed more than those of the bottom portion 514.

Etching (e.g., dry etching or wet etching) is subsequently performed, as shown in FIG. 5(c). Because of the ion implantation treatment, the etch rate of the top portion 512 is much larger than the etch rate of the bottom portion 514, and the top portion 512 is removed after the etching. For example, the etchant is selected to be $NF_3$. A second conductive material 516 (e.g., tungsten, cobalt, aluminum, or other suitable conductive materials) is formed to further fill the opening from bottom to top, as shown in FIG. 5(d). As an example, the substrate 118 of the semiconductor structure 501 is a silicon substrate, a III-V substrate, a silicon-germanium substrate, a germanium substrate, or other suitable substrates.

FIG. 6(a)-FIG. 6(d) depict other example diagrams showing contact formation in a feature using ion implantation. As shown in FIG. 6(a), a semiconductor structure 601 including a substrate 618 and a feature 606 formed in the substrate 618 is provided for contact formation, and the feature 606 corresponds to a gap or an opening (e.g., a contact hole, a via hole, a gate trench, etc.). A first conductive material 602 (e.g., tungsten, cobalt, aluminum, or other suitable conductive materials) is formed on one or more glue layers 604 (e.g., titanium and/or titanium nitride, etc.) to partially fill the opening of the feature 606. For example, a top portion of the glue layers 604 overhangs a bottom portion of the glue layers 604. The first conductive material 602 grows in conformation with the glue layers 604, and a top portion of the first conductive material 602 converges to seal the opening.

Ion implantation (indicated by arrows 608) is performed to treat the first conductive material 602, as shown in FIG. 6(b). For example, the feature 606 has a depth of about 100 nm and a width of about 20 nm, and the thickness of the first conductive material is about 10 nm. The ion implantation implements fluoride ions (e.g., $F^+$) with a dose of about $10^{15}$ $cm^{-2}$. An incident angle of the ion beams is about 45° relative to a vertical axis 610. Because of the merging of the top portion 612 of the first conductive material 602, the energy of the ion implantation is selected to be about 20 keV to provide a larger implant depth. Most ions are implanted in a top portion 612 of the first conductive material 602, while a bottom portion 614 of the first conductive material 602 receives a small number of ions or no ions. That is, the top portion 612 is associated with a much higher ion density than the bottom portion 614. As a result, physical/chemical properties of the top portion 612 have been changed more than those of the bottom portion 614.

Etching (e.g., dry etching or wet etching) is performed, as shown in FIG. 6(c). Because of the ion implantation treatment, the top portion 612 is removed after the etching. For example, the etchant is selected to be $NF_3$. A second conductive material 616 (e.g., tungsten, cobalt, aluminum, or other suitable conductive materials) is formed to further fill the opening from bottom to top, as shown in FIG. 6(d).

FIG. 7(a)-FIG. 7(c) depict example diagrams showing contact formation in a feature using ion implantation. As shown in FIG. 7(a), a semiconductor structure 701 including a substrate 718 and a feature 706 formed in the substrate 718 is provided for contact formation, and the feature 706 corresponds to a gap or an opening (e.g., a contact hole, a via hole, a gate trench, etc.). A first conductive material 702 (e.g., tungsten, cobalt, aluminum, or other suitable conductive materials) is formed on one or more glue layers 704

(e.g., titanium and/or titanium nitride, etc.) to partially fill the opening of the feature 706. For example, a top portion of the glue layers 704 overhangs a bottom portion of the glue layers 704. The first conductive material 702 grows in conformation with the glue layers 704, but a top portion of the first conductive material 702 does not converge to seal the opening.

Ion implantation (indicated by arrows 708) is performed to treat the first conductive material 702, as shown in FIG. 7(b). For example, the feature 706 has a depth of about 100 nm and a width of about 20 nm, and the thickness of the first conductive material is about 3 nm. The ion implantation implements nitrogen ions (e.g., $NO^+$), helium ions (e.g., $He^+$), or other suitable ions with a dose of about $10^{16}$ $cm^{-2}$. An incident angle of the ion beams is about 10° relative to a vertical axis 710. The energy of the ion implantation is selected to be about 10 keV. More ions are implanted in a top portion 712 of the first conductive material 702 than a bottom portion 714 of the first conductive material 702. That is, the top portion 712 is associated with a much higher ion density than the bottom portion 714. As a result, physical/chemical properties of the top portion 712 have been changed more than those of the bottom portion 714.

The deposition of a second conductive material 716 (e.g., tungsten, cobalt, aluminum, or other suitable conductive materials) begins to further fill the opening. Because of the ion implantation treatment, the formation rate of the second conductive material 716 on the top portion 712 is much lower than the formation rate of the second conductive material 716 on the bottom portion 714. Thus, the second conductive material 716 fills the opening from bottom to top, as shown in FIG. 7(c).

Figure 8:
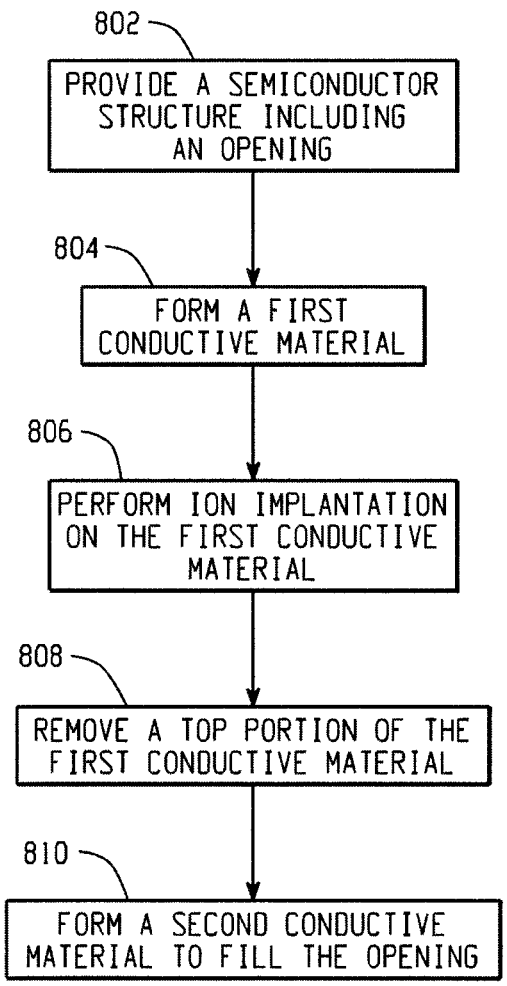
FIG. 8 depicts an example flow chart for contact formation in a feature using ion implantation.

FIG. 8 depicts an example flow chart for contact formation in a feature using ion implantation. At 802, a semiconductor structure is provided for contact formation. The semiconductor structure includes a feature corresponding to an opening formed by a bottom surface and one or more side surfaces. At 804, a first conductive material is formed on the bottom surface and the one or more side surfaces to partially fill the opening. The first conductive material includes a top portion and a bottom portion. At 806, ion implantation is performed on the first conductive material. The top portion of the first conductive material is associated with a first ion density, and the bottom portion of the first conductive material is associated with a second ion density smaller than the first ion density. At 808, at least part of the top portion of the first conductive material is removed (e.g., through dry etching or wet etching). At 810, a second conductive material is formed to fill the opening (e.g., from bottom to top).

Figure 9:
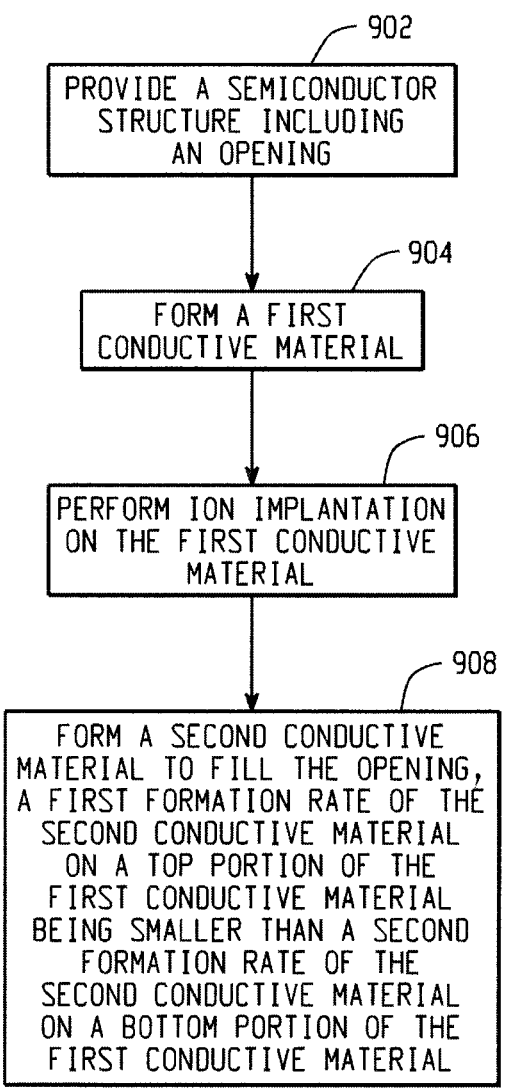
FIG. 9 depicts another example flow chart for contact formation in a feature using ion implantation.

FIG. 9 depicts another example flow chart for contact formation in a feature using ion implantation. At 902, a semiconductor structure is provided for contact formation. The semiconductor structure includes a feature corresponding to an opening formed by a bottom surface and one or more side surfaces. At 904, a first conductive material is formed on the bottom surface and the one or more side surfaces to partially fill the opening. The first conductive material includes a top portion and a bottom portion. At 906, ion implantation is performed on the first conductive material. At 908, a second conductive material is formed to fill the opening (e.g., from bottom to top). A first formation rate of the second conductive material on the top portion of the first conductive material is smaller than a second formation rate of the second conductive material on the bottom portion of the first conductive material.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, a system can be implemented to perform contact formation in a feature using ion implantation. The system includes: a deposition apparatus and an ion-implantation tool. The deposition apparatus is configured to form a first conductive material to partially fill an opening in a semiconductor structure. The first conductive material includes a top portion and a bottom portion. The ion-implantation tool is configured to perform ion implantation on the first conductive material. The top portion of the first conductive material is associated with a first ion density, and the bottom portion of the first conductive material is associated with a second ion density smaller than the first ion density. The deposition apparatus is further configured to form a second conductive material to fill the opening. The system further includes an etching component configured to remove at least part of the top portion of the first conductive material before the formation of the second conductive material.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as on, in, etc. that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "in"

used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may refer to shallow trench isolation features, poly-silicon gates, lightly doped drain regions, doped wells, contacts, vias, metal lines, or other types of circuit patterns or features to be formed on a semiconductor substrate. In addition, the term "semiconductor structure" used herein (including in the claims) may refer to various semiconductor devices, including transistors, capacitors, diodes, etc.

What is claimed is:

1. A method comprising:
   providing a semiconductor structure including an opening;
   forming a first conductive material such that a bottom surface and a side surface of the first conductive material define the opening, the first conductive material including a top portion and a bottom portion;
   performing ion implantation on the first conductive material at an incident angle without removal of the first conductive material, the top portion of the first conductive material being associated with a first ion density, the bottom portion of the first conductive material being associated with a second ion density lower than the first ion density;
   removing at least part of the top portion of the first conductive material; and
   forming a second conductive material to fill the opening.

2. The method of claim 1, wherein the first conductive material includes at least one of tungsten, cobalt, or aluminum.

3. The method of claim 1, wherein the second conductive material includes at least one of tungsten, cobalt, or aluminum.

4. The method of claim 1, wherein the opening is associated with an aspect ratio between a height of the opening and a width of the opening.

5. The method of claim 4, wherein the width of the opening is equal to about 20 nm, and the height of the opening is equal to about 100 nm.

6. The method of claim 1, wherein the top portion of the first conductive material is removed through dry etching.

7. The method of claim 6, wherein a first etch rate associated with the top portion of the first conductive material is faster than a second etch rate associated with the bottom portion of the first conductive material.

8. The method of claim 1, wherein the incident angle is about 45°.

9. The method of claim 1, wherein the ion implantation is performed using fluoride ions ($F^+$).

10. The method of claim 1, wherein the ion implantation is performed with an energy of about 10 keV or about 20 keV.

11. The method of claim 1, wherein the ion implantation is performed with a dose of about $10^{15}$ $cm^{-2}$.

12. The method of claim 1, wherein a thickness of the first conductive material is equal to about 3 nm or about 10 nm.

13. The method of claim 1, wherein removing the at least part of the first conductive material includes performing wet etching on the first conductive material.

14. A method comprising:
    providing a semiconductor structure including an opening;
    partially filling the opening with a glue layer such that a thickness of a top portion of the glue layer is larger than a thickness of a bottom portion of the glue layer;
    growing a first conductive material in conformation with the glue layer;
    performing ion implantation on the first conductive material;
    removing a top portion of the first conductive material, wherein performing the ion implantation permits the removal of the top portion of the first conductive material at a rate larger than a rate of removal of a bottom portion of the first conductive material; and
    substantially filling the opening with a second conductive material.

15. The method of claim 14, wherein growing the first conductive material includes depositing the first conductive material such that the top portion of the first conductive material converges to seal the opening.

16. The method of claim 14, wherein performing the ion implantation does not result in removal of the first conductive material.

17. The method of claim 14, wherein the removal of the top portion of the first conductive material includes wet etching the first conductive material.

18. A method comprising:
    providing a semiconductor structure including an opening;
    partially filling the opening with a first conductive material;
    performing ion implantation on the first conductive material; and
    forming a second conductive material on the first conductive material, wherein performing the ion implantation permits the formation of the second conductive material on a top portion of the first conductive material at a rate lower than a rate of the formation of the second conductive material on a bottom portion of the first conductive material.

19. The method of claim 18, wherein performing the ion implantation does not result in removal of the first conductive material.

* * * * *